US008583993B2

(12) United States Patent
Kalfon et al.

(10) Patent No.: US 8,583,993 B2
(45) Date of Patent: Nov. 12, 2013

(54) TURBO PARALLEL CONCATENATED CONVOLUTIONAL CODE IMPLEMENTATION ON MULTIPLE-ISSUE PROCESSOR CORES

(75) Inventors: Shai Kalfon, Hod Hasharon (IL); Alexander Rabinovitch, Kfar Yona (IL)

(73) Assignee: LSI Corporation, San Jose, CA (US)

( * ) Notice: Subject to any disclaimer, the term of this patent is extended or adjusted under 35 U.S.C. 154(b) by 223 days.

(21) Appl. No.: 13/162,734

(22) Filed: Jun. 17, 2011

(65) Prior Publication Data

US 2012/0324316 A1 Dec. 20, 2012

(51) Int. Cl.
*H03M 13/00* (2006.01)

(52) U.S. Cl.
USPC ............................ 714/780; 714/786; 714/752

(58) Field of Classification Search
USPC .......................................... 714/780, 786, 752
See application file for complete search history.

(56) References Cited

U.S. PATENT DOCUMENTS

| | | | | |
|---|---|---|---|---|
| 5,970,085 | A * | 10/1999 | Yi | 370/342 |
| 6,023,783 | A * | 2/2000 | Divsalar et al. | 714/792 |
| 6,094,427 | A * | 7/2000 | Yi | 370/331 |
| 6,519,732 | B1 * | 2/2003 | Li | 714/755 |
| 6,598,203 | B1 * | 7/2003 | Tang | 714/790 |
| 6,651,209 | B1 * | 11/2003 | Morsberger et al. | 714/755 |
| 6,772,391 | B1 * | 8/2004 | Shin | 714/786 |
| 7,765,457 | B2 | 7/2010 | Amer | |
| 8,201,048 | B2 * | 6/2012 | Eroz et al. | 714/755 |
| 8,250,429 | B2 * | 8/2012 | Lin | 714/755 |
| 8,271,848 | B2 * | 9/2012 | Bresalier et al. | 714/755 |
| 8,365,047 | B2 * | 1/2013 | Palanki et al. | 714/776 |
| 2002/0087923 | A1 * | 7/2002 | Eroz et al. | 714/702 |
| 2010/0272011 | A1 | 10/2010 | Palanki et al. | |
| 2012/0082053 | A1 * | 4/2012 | Qiu et al. | 370/252 |

OTHER PUBLICATIONS

Sug H. Jeong et al., "Bit Manipulation Accelerator for Communication Systems Digital Signal Processor," EURASIP Journal on Applied Signal Processing 2005:16, pp. 2655-2663 (2005).

* cited by examiner

*Primary Examiner* — Albert Decady
*Assistant Examiner* — Osman Alshack
(74) *Attorney, Agent, or Firm* — Otterstedt, Ellenbogen & Kammer, LLP

(57) ABSTRACT

An iterative PCCC encoder includes a first delay line operative to receive at least one input data sample and to generate a plurality of delayed samples as a function of the input data sample. The encoder further includes a second delay line including a plurality of delay elements connected in a series configuration. An input of a first one of the delay elements is adapted to receive a sum of first and second signals, the first signal generated as a sum of the input data sample and at least one of the delayed samples, and the second signal generated as an output of a single one of the delay elements. A third delay line in the encoder is operative to generate an output data sample as a function of the sum of the first and second signals and a delayed version of the sum of the first and second signals.

22 Claims, 3 Drawing Sheets

300

TURBO PARALLEL CONCATENATED CONVOLUTIONAL CODE IMPLEMENTATION ON MULTIPLE-ISSUE PROCESSOR CORES

FIELD OF THE INVENTION

The present invention relates generally to electronic circuits, and more particularly relates to information coding techniques.

BACKGROUND OF THE INVENTION

Turbo (i.e., iterative) parallel concatenated convolutional codes (PCCC's), commonly referred to as "turbo codes," find widespread application, for example, in modern baseband (e.g., mobile broadband) systems including, but not limited to, Long Term Evolution (LTE) and Wideband Code Division Multiple Access (WCDMA) devices. Turbo codes are essentially PCCC's having an encoder formed by two or more constituent systematic recursive convolutional encoders joined by an interleaver. A received data stream is usually decoded using maximum likelihood decoding.

Typically, turbo codes are implemented in a straightforward manner, meaning that an encoded data stream is processed on a bit-by-bit basis. However, since the input block length is normally very large, maximum likelihood encoding would be significantly complex and thus impractical. A bit-by-bit processing approach, whereby one bit of the input data stream is processed per iteration (e.g., one bit/iteration), leads to poor performance and is therefore undesirable. Another known turbo code implementation approach is to utilize look-up-tables, which slightly improves the bit/cycle performance. This approach, however, requires a significantly large memory allocation for implementing the look-up tables and is thus not practical, particularly for standard digital signal processor (DSP) machines and/or other processing systems in which memory is a commodity.

SUMMARY OF THE INVENTION

The present invention, in illustrative embodiments thereof, provides techniques for performing turbo PCCC encoding in a manner which enables required output data bits to be computed with a higher level of parallelism compared to conventional approaches and without the need for look-up tables or costly memory allocation for implementing the look-up tables. Furthermore, aspects of the invention reduce the dependence upon results of adjacent historic data samples, thereby allowing encoding to be performed in a distributed manner.

In accordance with an embodiment of the invention, an iterative PCCC encoder includes a first delay line operative to receive at least one input data sample and to generate a plurality of delayed samples as a function of the input data sample. The encoder further includes a second delay line including a plurality of delay elements connected in a series configuration. An input of a first one of the delay elements is adapted to receive a sum of first and second signals, the first signal generated as a sum of the input data sample and at least one of the delayed samples, and the second signal generated as an output of a single one of the delay elements. A third delay line in the encoder is operative to generate an output data sample as a function of the sum of the first and second signals and a delayed version of the sum of the first and second signals.

In accordance with another embodiment of the invention, a method for performing iterative PCCC encoding includes the steps of: generating a first plurality of data samples, each of the data samples being generated by delaying an input data sample, Xin[n], by a prescribed delay amount, where n is an integer indicative of an n-th sample in a data stream; summing the input data sample Xin[n] with at least one of the data samples in the first plurality of data samples to thereby generate a first signal; generating a second plurality of data samples, each of the data samples in the second plurality of data samples being generated by delaying a sum of the first signal and a second signal by respective delay amounts, a given one of the data samples in the second plurality of data samples forming the second signal; and generating an output data sample, Yout[n], as a function of the sum of the first and second signals and a delayed version of the sum of the first and second signals.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

The present invention, according to aspects thereof, will be described herein in the context of illustrative turbo PCCC circuit architectures and coding methodologies, at least portions of which may be implemented, for example, on a digital signal processor (DSP) machine (e.g., DSP core) or alternative processor (e.g., microprocessor, central processing unit (CPU), etc.). It is to be appreciated, however, that the invention is not limited to the circuit architectures and/or methods shown and described herein. Rather, the invention is more generally applicable to techniques for beneficially enhancing turbo PCCC coding by increasing the level of parallel computations performed. In this manner, techniques of the invention provide a transformation for turbo PCCC coding which achieves a significant improvement in data throughput compared to conventional approaches. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Concatenated coding schemes were proposed as a method for achieving large coding gains by combining two or more relatively simple building-block or component codes, sometimes referred to as constituent codes (see, e.g., G. D. Forney, Jr., "Concatenated Codes," The M.I.T. Press, 1966, which is incorporated herein by reference in its entirety). Turbo codes were first introduced in 1993 in an article by Berrou, Glavieux and Thitimajshima (see, e.g., C. Berrou et al., "Near Shannon Limit Error-Correcting Coding and Decoding: Turbo-Codes," *Proceedings of the IEEE International Conference on Communications*, pp. 1064-1070, 1993, the disclosure of which is incorporated herein by reference in its entirety). That article demonstrated that a turbo code together with an iterative decoding algorithm could provide performance, in terms of bit error rate (BER), which approaches the theoretical limit. In general, a turbo code encoder provides a parallel concatenation of multiple (i.e., two or more) recursive systematic convolutional (RSC) codes which are typically, though not necessarily, identical to one another, applied to an input bit sequence. An output of the encoder includes systematic bits (i.e., the input bit sequence itself) and parity bits which can be selected to provide a desired rate of encoding.

Figure 1:
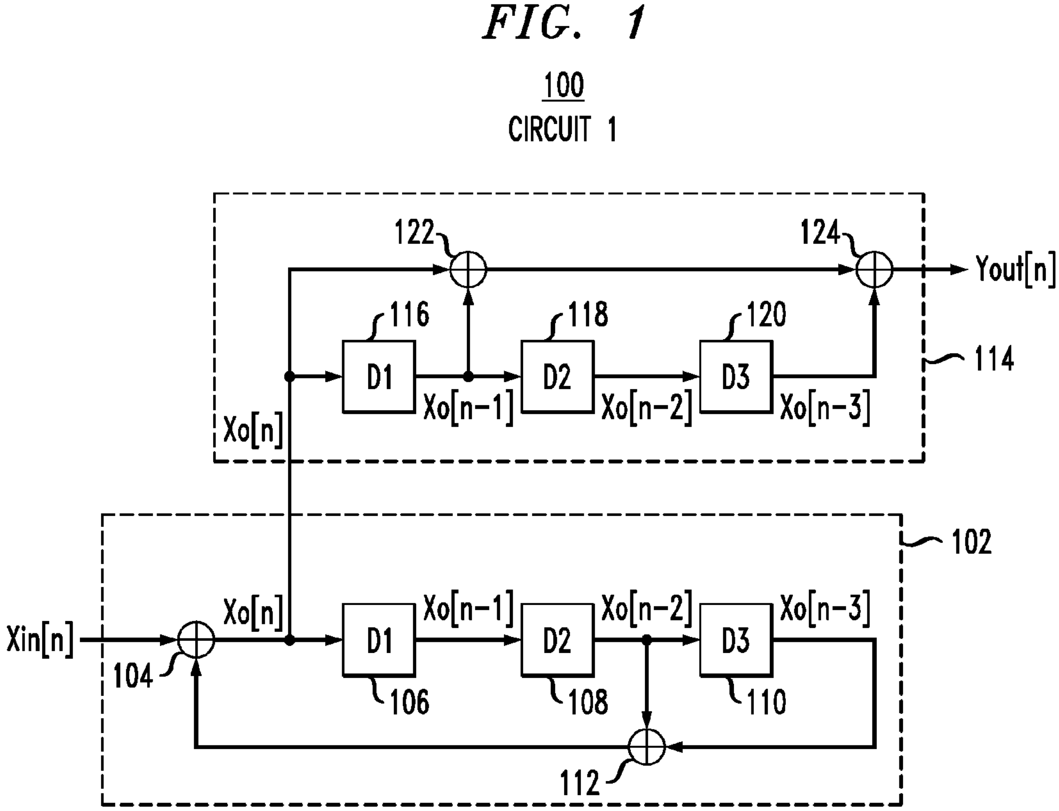
FIG. 1 is a block diagram illustrating at least a portion of an exemplary encoder circuit which may be utilized for performing turbo PCCC encoding.

FIG. 1 is a block diagram illustrating at least a portion of an exemplary encoder circuit 100 which may be utilized for performing turbo PCCC encoding. The encoder circuit 100 comprises a first delay line 102 including a first adder block 104, a first delay element 106 having a first delay D1 associated therewith, a second delay element 108 having a second delay D2 associated therewith, a third delay element 110 having a third delay D3 associated therewith, and a second adder block 112. Each of the delay values D1, D2 and D3 may be different or, alternatively, one or more of the delay values may be equal. It is to be understood that the invention is not limited to any particular delay values. Delay elements 106, 108 and 110 are preferably coupled together in series, such as, for example, in a tapped delay line arrangement (i.e., an output of one delay element is connected to an input of an adjacent delay element in the delay line 102).

The first adder block 104 is adapted to receive an input signal, Xin[n], which may be an n-th sample in a data stream (where n is an integer), applied to the encoder circuit 100. Adder block 104 is preferably operative to generate a signal, Xo[n], which is a summation of input signal Xin[n] and a signal generated by second adder block 112. Delay element 106 is preferably adapted to receive signal Xo[n] from adder block 104 and is operative to generate a signal, Xo[n−1], which is essentially signal Xo[n] which has been delayed by D1. Delay element 108 is preferably adapted to receive signal Xo[n−1] from delay element 106 and is operative to generate a signal, Xo[n−2], which is essentially signal Xo[n−1] which has been delayed by D2. Likewise, delay element 110 is preferably adapted to receive signal Xo[n−2] from delay element 108 and is operative to generate a signal, Xo[n−3], which is essentially signal Xo[n−2] which has been delayed by D3. The signal generated by adder block 112 is preferably a summation of signals Xo[n−2] and Xo[n−3]. In this manner, signal Xo[n] presented to the first delay element 106 is equal to the input signal Xin[n] summed with delayed versions of the input signal: Xo[n]=Xin[n]+Xo[n−2]+Xo[n−3]. Thus, delay line 102 represents an iterative structure.

The encoder circuit 100 further comprises a second delay line 114 including a first delay element 116 having a first delay D1 associated therewith, a second delay element 118 having a second delay D2 associated therewith, a third delay element 120 having a third delay D3 associated therewith, a first adder block 122 and a second adder block 124. Each of the delay values D1, D2 and D3 may be different or, alternatively, one or more of the delay values may be equal to one another. Furthermore, one or more of the delay values in the first and second delay lines 102 and 114, respectively, may be equal to one another. Again, it is to be understood that the invention is not limited to any particular delay values. Delay elements 116, 118 and 120 are preferably coupled together in series, such as, for example, in a tapped delay line arrangement (i.e., an output of one delay element is connected to an input of an adjacent delay element in the delay line 114).

Signal Xo[n] from adder block 104 is supplied to delay element 116 and concurrently to adder block 122. Delay element 116 is preferably operative to generate a signal Xo[n−1] which is essentially signal Xo[n] delayed by D1. Signal Xo[n−1] is supplied to delay element 118 and to adder block 122. Delay element 118 is preferably operative to generate a signal Xo[n−2] which is essentially signal Xo[n−1] delayed by D2. Signal Xo[n−2] is supplied to delay element 120. Delay element 120 is preferably operative to generate a signal Xo[n−3] which is essentially signal Xo[n−2] delayed by D3. An output signal generated by adder block 122, which is a summation of signals Xo[n] and Xo[n−1] (i.e., Xo[n]+Xo[n−1]) is added with signal Xo[n−3] to generate an output signal Yout[n] of the encoder circuit 100, where:

$$Yout[n]=Xo[n]+Xo[n-1]+Xo[n-3] \quad (1)$$

Figure 2:
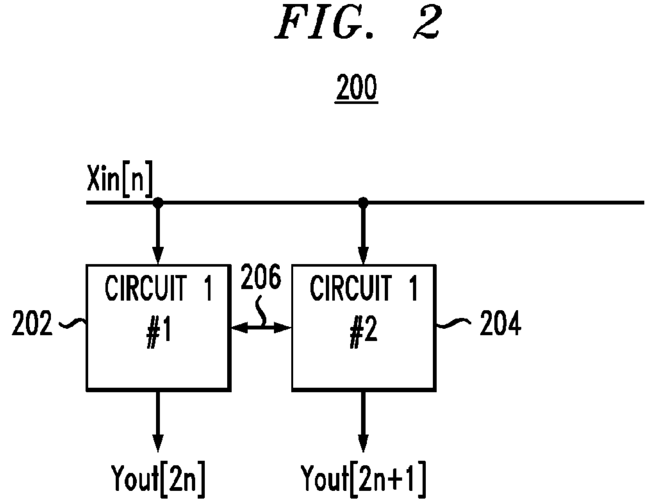
FIG. 2 is a block diagram depicting at least a portion of an illustrative hardware implementation of a turbo PCCC encoder utilizing a plurality of the exemplary encoder circuit shown in FIG. 1.

FIG. 2 is a block diagram of an illustrative hardware implementation of a turbo PCCC encoder 200. Turbo PCCC encoder 200 preferably includes first and second encoder circuits 202 and 204, respectively. First encoder circuit 202 is preferably operative to receive an input sample, Xin[n], and to generate a corresponding output sample, Yout[2n]. Second encoder circuit 204 is preferably operative to input sample Xin[n] and to generate a corresponding output sample, Yout[2n+1]. Output sample Yout[2n+1] is preferably a next subsequent sample to output sample Yout[2n] in an output data stream comprising samples Yout[2n] and Yout[2n+1]. A connection 206 is depicted between first and second encoder circuits 202 and 204. Connection 206 is indicative of a mutual dependence between the two encoder circuits 202 and 204, as previously discussed in conjunction with encoder circuit 100 of FIG. 1. One or more of encoder circuits 202 and 204 may be implemented in a manner consistent with illustrative encoder circuit 100 shown in FIG. 1. In encoder 200, only two output samples, namely, Yout[2n] and Yout[2n+1], are determined (in parallel) per iteration.

As apparent from FIG. 1, due to the iterative configuration of the encoder circuit 100, signal Xo[n] depends upon the determination of signal Xo[n−2]. Thus, since only delay elements 106 and 108 are mutually independent of one another, only two output samples, Xo[n] and Xo[n−1], can be generated in parallel in a single hardware cycle/iteration. The encoder arrangement depicted in FIG. 1, therefore, does not adequately take advantage of the parallelism that may be available on certain processing architectures, such as, for example, a DSP core.

In accordance with an important aspect of the invention, a transformation of the encoder circuit 100 shown in FIG. 1 is preferably performed which allows enhanced parallel calculation of a greater number of samples in a turbo PCCC implementation. Moreover, such transformation enables a parallel determination of samples to be performed utilizing a standard DSP instruction set, which may include, for example, bit shifting and exclusive-OR functionalities. Embodiments of the invention therefore provide a turbo PCCC encoder which is able to achieve a significant improvement in bit/iteration performance compared to conventional approaches, among other advantages, as will be described in further detail below.

As previously stated in connection with encoder circuit 100 illustrated in FIG. 1, signal Xo[n] supplied to both delay elements 106 and 116 can be expressed as:

$$Xo[n]=Xo[n-2]+Xo[n-3]+Xin[n] \quad (2)$$

where n is an integer indicative of a given sample number in the input data stream. By way of example only and without loss of generality, an illustrative transformation is presented herein which beneficially achieves a higher level of parallelism, and thus provides improved bit-per-iteration performance (i.e., higher overall data throughput) compared to conventional turbo PCCC encoder methodologies. Specifically, using equation (2) above, the term Xo[n−2] can be determined by adding two delay units to each of the terms in the expression to thereby yield the following equivalent expression:

$$Xo[n-2]=Xo[n-4]+Xo[n-5]+Xin[n-2] \quad (3)$$

In a similar manner, the term Xo[n−3] can be determined from equation (2) above by adding three delay units to each of the terms in the expression to thereby obtain the following equivalent expression:

$$Xo[n-3]=Xo[n-5]+Xo[n-6]+Xin[n-3] \quad (4)$$

Hence, an expression for Xo[n] may be computed by substituting equation (3) for the term Xo[n−2] in equation (2) and by substituting equation (4) for the term Xo[n−3], as follows:

$$Xo[n]=Xo[n-4]+Xo[n-5]+Xin[n-2]+Xo[n-5]+Xo[n-6]+Xin[n-3]+Xin[n] \quad (5)$$

Equation (5) above can be simplified by recognizing that the two Xo[n−5] terms cancel one another, thereby yielding the following expression for Xo[n]:

$$Xo[n]=Xo[n-4]+Xo[n-6]+Xin[n]+Xin[n-2]+Xin[n-3] \quad (6)$$

The term Xo[n−4] in equation (6) can be determined by adding four delay units to each of the terms in equation (2) above to thereby obtain the following equivalent expression:

$$Xo[n-4]=Xo[n-6]+Xo[n-7]+Xin[n-4] \quad (7)$$

Substituting equation (7) into equation (6) for the term Xo[n−4] results in the following expression for Xo[n]:

$$Xo[n]=Xo[n-6]+Xo[n-7]+Xin[n-4]+Xo[n-6]+Xin[n]+Xin[n-2]+Xin[n-3] \quad (8)$$

Simplifying equation (8) above by canceling the two Xo[n−6] terms yields the following expression for Xo[n]:

$$Xo[n]=Xo[n-7]+Xin[n]+Xin[n-2]+Xin[n-3]+Xin[n-4] \quad (9)$$

As apparent from equation (9) above, the signal Xo[n] depends only on the historic term Xo[n−7]. From a practical implementation standpoint, this means that seven output bits can be computed in parallel using shifted inputs, Xin[n−2], Xin[n−3] and Xin[n−4], and previously determined (i.e., historic) output values. Of course, as will become apparent to those skilled in the art given the teachings herein, the present invention is not limited to the transformation set forth in equation (9). Rather, a greater or lesser amount of parallelism can be achieved as desired, depending on the particular coding application. An advantage of the improved data throughput afforded by using additional parallelism in the encoder circuit would be mitigated somewhat by an increase in the number of delay elements required in one or more of the delay lines in the PCCC encoder, although increasing the number of delay elements in the PCCC encoder can typically be implemented without a significant increase in cost. Conversely, the benefit of using a reduced number of delay elements in one or more delay lines in the encoder would be tempered by a decrease in the overall data throughput of the encoder.

Figure 3:
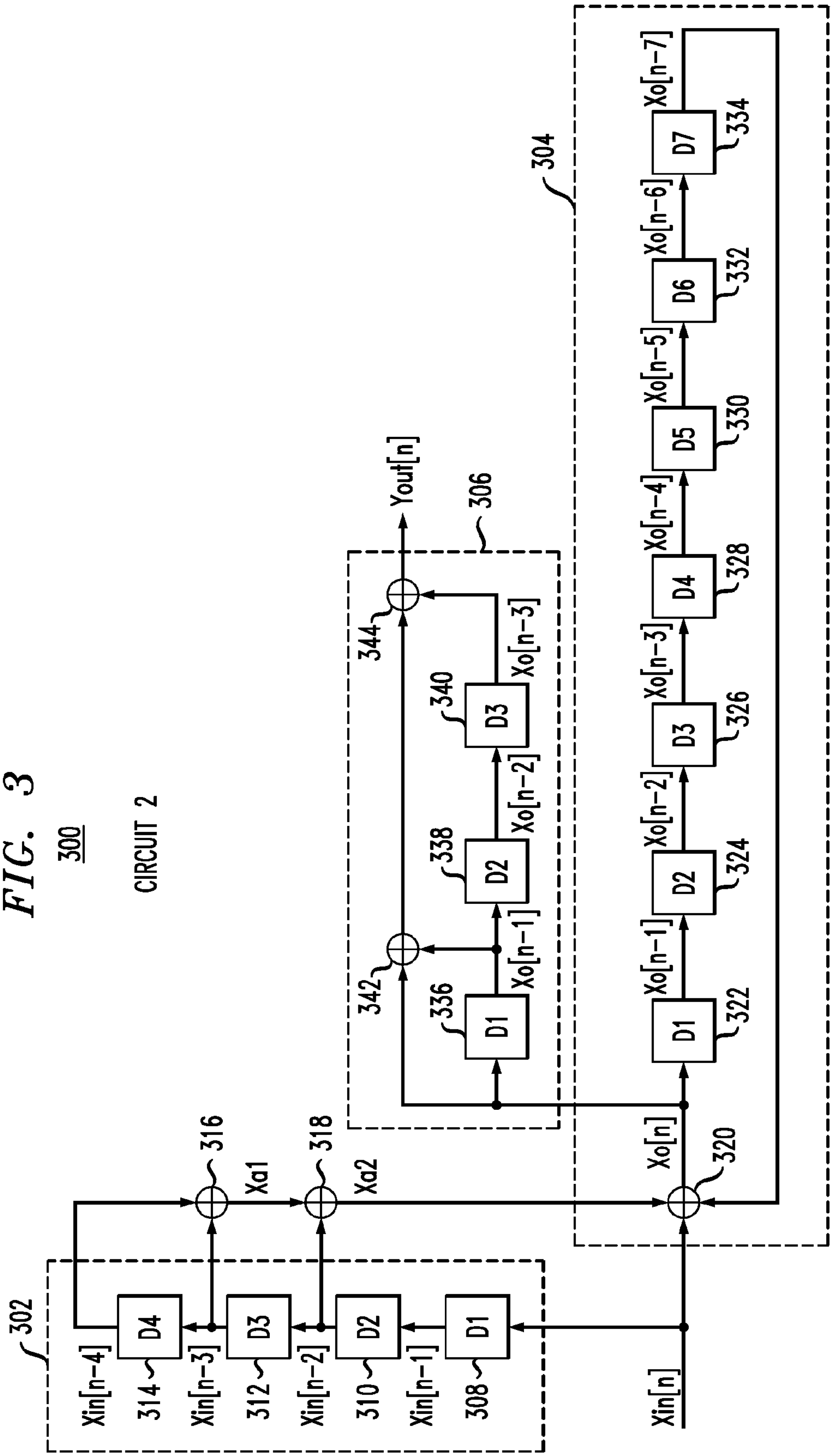
FIG. 3 is a block diagram depicting at least a portion of an exemplary turbo PCCC encoder circuit, according to an embodiment of the present invention.

With reference now to FIG. 3, at least a portion of an exemplary turbo PCCC encoder circuit 300 is depicted, according to an embodiment of the present invention. Encoder circuit 300 preferably comprises a first delay line 302, which may be an input delay line, a second delay line 304, which may be a first output delay line, and a third delay line 306, which may be a second output delay line. One or more of the delay lines 302, 304 and 306 may be implemented as a tapped delay line as shown, although alternative means for generating delay are similarly contemplated by the invention, including, but not limited to, sequential logic circuitry (e.g., a shift register or counter), a DSP, etc. Encoder circuit 300 is preferably configured to implement the exemplary transformation represented in equation (9) above.

More particularly, first delay line 302 preferably includes a plurality of delay elements connected together in a series configuration, such that an output of a given delay element is coupled with an input of an adjacent delay element in the delay line. Specifically, first delay line 302 includes a first delay element 308 having a delay D1 associated therewith, a second delay element 310 having a delay D2 associated therewith, a third delay element 312 having a delay D3 associated therewith, and a fourth delay element 314 having a delay D4 associated therewith. Delay element 308 is adapted to receive an input signal, Xin[n], which may a sample in an input data stream supplied to encoder circuit 300, and is operative to generate a signal, Xin[n−1], which is indicative of signal Xin[n] delayed by D1, where n is an integer indicative of a given sample number in the input data stream. Delay element 310 is adapted to receive signal Xin[n−1] and is operative to generate a signal, Xin[n−2], which is indicative of signal Xin[n−1] delayed by D2. Delay element 312 is adapted to receive signal Xin[n−2] and is operative to generate a signal, Xin[n−3], which is indicative of signal Xin[n−2] delayed by D3. Likewise, delay element 314 is adapted to receive signal Xin[n−3] and is operative to generate a signal, Xin[n−4], which is indicative of signal Xin[n−3] delayed by D4.

Signal Xin[n−4] generated by delay element 314 is preferably supplied to a first adder 316. First adder 316 is operative to generate a signal, Xa1, which is a summation of signal Xin[n−4] and signal Xin[n−3] generated by delay element 312; namely, Xa1=Xin[n−3]+Xin[n−4]. A second adder 318 is adapted to receive signal Xa1 generated by adder 316 and signal Xin[n−2] generated by delay element 310 and is operative to generate a signal, Xa2, which is a summation of the output signal of adder 316 and Xin[n−2]; namely, Xa2=Xin[n−2]+Xin[n−3]+Xin[n−4]. In this manner, delay line 302, in combination with adders 316 and 318, are operative to generate the shifted input sample terms in equation (9) above; namely, Xin[n−2], Xin[n−3] and Xin[n−4].

Second delay line 304 preferably includes an adder 320, or alternative summation circuitry, and a plurality of delay elements connected together in a series configuration, such that an output of a given delay element is coupled with an input of an adjacent delay element in the delay line. As will be described in further detail below, a first one of the delay elements in delay line 304 is preferably operative to receive a first signal, including input signal Xin[n] and at least one signal which is a delayed version of the input signal (e.g., signals Xin[n−2] and Xin[n−4]), and a second signal generated as an output of a single one of the delay elements in delay line 304. In this manner, delay line 304 is operative to generate the sample term Xo[n−7] in equation (9) above.

More particularly, second delay line 304 includes a first delay element 322 having a delay D1 associated therewith, a second delay element 324 having a delay D2 associated therewith, a third delay element 326 having a delay D3 associated therewith, a fourth delay element 328 having a delay D4 associated therewith, a fifth delay element 330 having a delay D5 associated therewith, a sixth delay element 332 having a delay D6 associated therewith, and a seventh delay element 334 having a delay D7 associated therewith. It is to be appreciated that the invention is not limited to any specific number of delay elements in delay line 304. Nor is the invention limited to any specific delay values used for the respective delay elements 322 through 334; rather, each of delay values D1 through D7 may be the same or, alternatively, one or more of the delay values may be different relative to one another. It is also to be appreciated that the delay values D1 through D4 in delay line 302 are not necessarily equivalent to delay values D1 through D4 in delay line 304, despite the apparent similar naming conventions employed.

Delay element 322 is adapted to receive a signal, Xo[n], supplied thereto and is operative to generate a signal, Xo[n−1], which is indicative of signal Xo[n] delayed by D1 (i.e., shifted). Delay element 324 is adapted to receive signal Xo[n−1] and is operative to generate a signal, Xo[n−2], which is indicative of signal Xo[n−1] delayed by D2. Delay element 326 is adapted to receive signal Xo[n−2] and is operative to generate a signal, Xo[n−3], which is indicative of signal Xo[n−2] delayed by D3. Delay element 328 is adapted to receive signal Xo[n−3] and is operative to generate a signal, Xo[n−4], which is indicative of signal Xo[n−3] delayed by D4. Delay element 330 is adapted to receive signal Xo[n−4] and is operative to generate a signal, Xo[n−5], which is indicative of signal Xo[n−4] delayed by D5. Delay element 332 is adapted to receive signal Xo[n−5] and is operative to generate a signal, Xo[n−6], which is indicative of signal Xo[n−5] delayed by D6. Likewise, delay element 334 is adapted to receive signal Xo[n−6] and is operative to generate a signal, Xo[n−7], which is indicative of signal Xo[n−6] delayed by D7.

Signal Xo[n−7], generated by the last delay element 334 in delay line 304, is preferably fed back to the beginning of delay line 304 through adder 320 in an iterative arrangement. More particularly, signal Xo[n] generated by adder 320 is preferably a summation of input signal Xin[n], signal Xa2, which, as previously described, is equal to Xin[n−2]+Xin[n−3]+Xin[n−4], and signal Xo[n−7]. Thus, signal Xo[n] supplied to delay element 322 may be expressed as Xo[n]=Xin[n]+Xin[n−2]+Xin[n−3]+Xin[n−4]+Xo[n−7], which is the same as equation (9) above.

Signal Xo[n] is concurrently supplied to delay line 306. Delay line 306 may be implemented in a manner consistent with delay line 114 shown in FIG. 1. Specifically, delay line 306 preferably includes a first delay element 336 having a first delay D1 associated therewith, a second delay element 338 having a second delay D2 associated therewith, a third delay element 340 having a third delay D3 associated therewith, a first adder block 342 and a second adder block 344. Each of the delay values D1, D2 and D3 may be different or, alternatively, one or more of the delay values may be equal to one another. Moreover, it is to be appreciated that the delay values D1 through D3 in delay line 302 and the delay values D1 through D3 in delay line 304 are not necessarily equivalent to delay values D1 through D3 in delay line 306, despite their apparent similar naming conventions.

Signal Xo[n] from adder block 320 is supplied to delay element 336 and concurrently to adder block 342. Delay element 336 is preferably operative to generate a signal Xo[n−1], which is essentially signal Xo[n] delayed by D1. Signal Xo[n−1] is concurrently supplied to delay element 338 and to adder block 342. Delay element 338 is preferably operative to generate a signal Xo[n−2] which is essentially signal Xo[n−1] delayed by D2. Signal Xo[n−2] is supplied to delay element 340. Delay element 340 is preferably operative to generate a signal Xo[n−3] which is essentially signal Xo[n−2] delayed by D3. An output signal generated by adder block 342, which is a summation of signals Xo[n] and Xo[n−1] (i.e., Xo[n]+Xo[n−1]) is fed to adder 344 where it is added with signal Xo[n−3] to generate an output signal Yout[n] of the encoder circuit 300, where Yout[n]=Xo[n]+Xo[n−1]+Xo[n−3], which is equivalent to equation (1) above.

In accordance with another embodiment of the invention, turbo PCCC encoder circuit 300 can be simplified somewhat by reusing one or more output results generated in delay line 304 in delay line 306. For example, it is apparent from FIG. 3 that the results Xo[n−1] and Xo[n−3] utilized by adders 342 and 344, respectively, are available from delay line 304. Accordingly, the output Xo[n−1] generated by delay element 322 may be supplied to adder 342 and the output Xo[n−3] generated by delay element 326 may be supplied to adder 344, thereby eliminating the need for delay elements 336, 338 and 340 in delay line 306.

Figure 4:
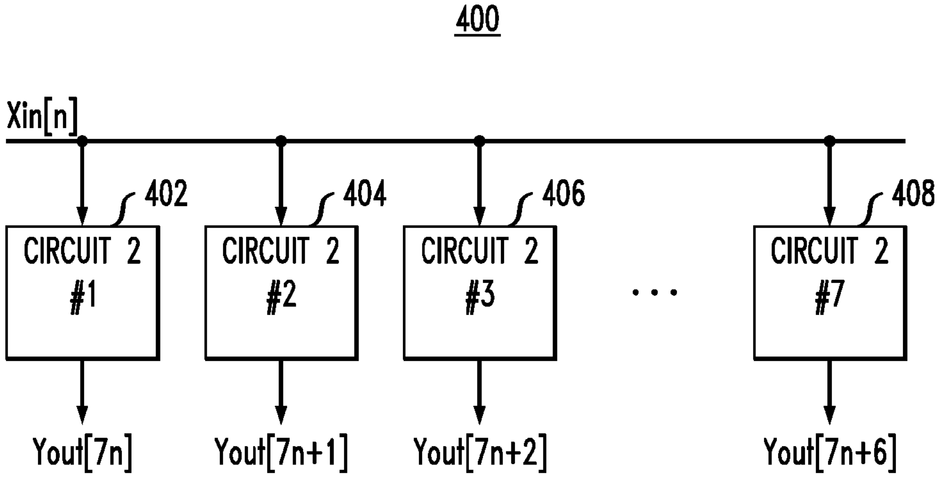
FIG. 4 is a block diagram depicting at least a portion of an illustrative hardware implementation of a turbo PCCC encoder utilizing a plurality of the exemplary encoder circuit shown in FIG. 3, according to an embodiment of the present invention.

FIG. 4 is a block diagram depicting at least a portion of an exemplary hardware implementation of a turbo PCCC encoder 400 utilizing a plurality of encoder circuits, according to an embodiment of the invention. Turbo PCCC encoder 400 preferably includes seven encoder circuits, which are represented in part by encoder circuits 402, 404, 406, and 408. Each of the encoder circuits 402 through 408 is preferably operative to receive an input sample, Xin[n], and to generate a corresponding output sample, Yout[7n], Yout[7n+1], Yout[7n+2], . . . Yout[7n+6], respectively. One or more of encoder circuits 402, 404, 406, 408 may be implemented in a manner consistent with illustrative encoder circuit 300 shown in FIG. 3. As apparent from FIG. 4, seven output samples, namely, Yout[7n]:Yout[7n+6], are determined in parallel per iteration, thereby significantly increasing data throughput in encoder 400 compared to other encoding methodologies, as previously stated. Moreover, in contrast to the illustrative turbo PCCC encoder 200 shown in FIG. 2, there is no interconnection between any of the encoder circuits 402, 404, 406 and 408 in encoder 400. Thus, encoder 400 beneficially eliminates the mutual dependence between encoder circuits which is present in other PCCC encoding arrangements (e.g., interconnection 206 shown in FIG. 2).

Techniques of the invention described herein may be performed using hardware and/or software aspects. Software includes, but is not limited to, firmware, resident software, microcode, etc., which can be executed on hardware which may include, but is not limited, a central processing unit (CPU), DSP, hardware state machine, programmable logic array (PLA), etc. By way of illustration only and without limitation, according to an embodiment of the invention at least a portion of the turbo PCCC encoder (e.g., according to FIGS. 3 and 4) may be implemented using the exemplary MATLAB® (a registered trademark of The MathWorks, Inc., Natick, Mass.) pseudo-code shown below:

```
function turbo__out =
turbo__encoder__2(code__block__bits,code__block__size)
% Initialize first three samples Xout(1) through Xout(3) to zero
Xout(1) = 0;
Xout(2) = 0;
Xout(3) = 0;
% Compute next eight samples n=4 through n=11
for n = 4:11,
    Xout(n) = mod(Xout(n−2) + Xout(n−3) + code__block__bits(n−3), 2);
end;
for n = 12:code__block__size,
    Xout(n) = mod(Xout(n−7) + code__block__bits(n−3) +
    code__block__bits(n−5) +
code__block__bits(n−6) + code__block__bits(n−7), 2);
end;
for n = 4:code__block__size,
    turbo__out(n−3) = mod(Xout(n) + Xout(n−1) + Xout(n−3), 2)
end;
```

The lines of executable MATLAB pseudo-code shown above may be thought of as respective steps in a turbo PCCC encoding methodology according to an embodiment of the invention. This pseudo-code can be implemented in various hardware including, but not limited to, an LTE or any third generation (3G) acceleration chip, or implemented in a field programmable gate array (FPGA) or application specific integrated circuit (ASIC). It is to be understood that the pseudo-code is provided as an illustration only, and that other means of implementing one or more aspects of the invention are contemplated, as will become readily apparent to those skilled in the art given the teachings herein.

One or more embodiments of the invention or elements thereof may be implemented in the form of an article of manufacture including a machine readable medium that contains one or more programs which when executed implement such method step(s); that is to say, a computer program product including a tangible computer readable recordable storage medium (or multiple such media) with computer usable program code stored thereon in a non-transitory manner for performing the method steps indicated. Furthermore, one or more embodiments of the invention or elements thereof can be implemented in the form of an apparatus including a memory and at least one processor that is coupled with the memory and operative to perform, or facilitate the performance of, exemplary method steps.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a tangible computer-readable recordable storage medium (or multiple such media). Appropriate interconnections via bus, network, and the like can also be included.

Figure 5:
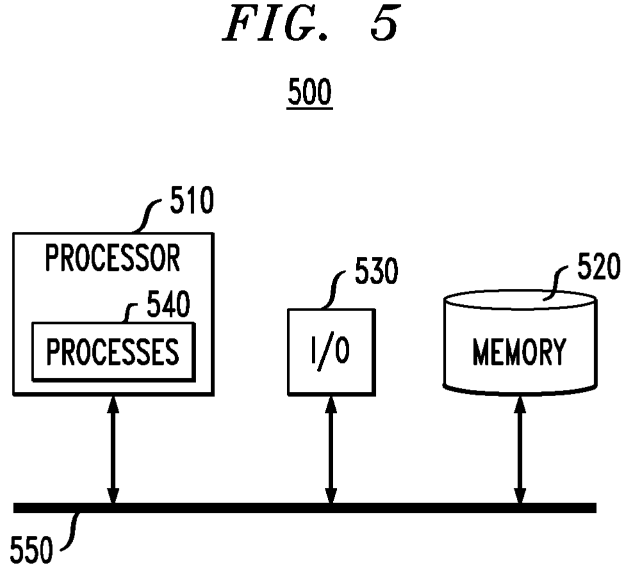
FIG. 5 is a block diagram depicting at least a portion of an exemplary processing system, formed in accordance with an aspect of the present invention.

Aspects of the invention may be particularly well-suited for use in an electronic device or alternative system (e.g., broadband communications system). For example, FIG. 5 is a block diagram depicting at least a portion of an exemplary processing system 500 formed in accordance with an aspect of the invention. System 500, which may represent, for example, a turbo PCCC encoder or a portion thereof, may include a processor 510, memory 520 coupled with the processor (e.g., via a bus 550 or alternative connection means), as well as input/output (I/O) circuitry 530 operative to interface with the processor. The processor 510 may be configured to perform at least a portion of the functions of the present invention (e.g., by way of one or more processes 540 which may be stored in memory 520), illustrative embodiments of which are shown in the previous figures and described herein above.

It is to be appreciated that the term "processor" as used herein is intended to include any processing device, such as, for example, one that includes a CPU and/or other processing circuitry (e.g., DSP, network processor, microprocessor, etc.). Additionally, it is to be understood that a processor may refer to more than one processing device, and that various elements associated with a processing device may be shared by other processing devices. For example, in the case of encoder circuit 300 shown in FIG. 3, each of the delay elements 322 through 334 may be implemented in parallel (i.e., concurrently) using a separate corresponding DSP core, as in a distributed computing configuration. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., display, etc.) for presenting the results associated with the processor.

Accordingly, an application program, or software components thereof, including instructions or code for performing the methodologies of the invention, as described herein, may be stored in a non-transitory manner in one or more of the associated storage media (e.g., ROM, fixed or removable storage) and, when ready to be utilized, loaded in whole or in part (e.g., into RAM) and executed by the processor. In any case, it is to be appreciated that at least a portion of the components shown in the previous figures may be implemented in various forms of hardware, software, or combinations thereof (e.g., one or more DSPs with associated memory, application-specific integrated circuit(s) (ASICs), functional circuitry, one or more operatively programmed general purpose digital computers with associated memory, etc). Given the teachings of the invention provided herein, one of ordinary skill in the art will be able to contemplate other implementations of the components of the invention.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in essentially any application and/or electronic system in which PCCC's may be employed. Suitable systems for implementing techniques of the invention may include, but are not limited to, mobile phones, personal digital assistants (PDA's), personal computers, wireless communication networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An iterative parallel concatenated convolutional code (PCCC) encoder, comprising:

a first delay line configured in a non-iterative manner and operative to receive at least one input data sample and to generate a plurality of delayed samples as a function of the input data sample;

a second delay line including a plurality of delay elements connected in a series configuration, an input of a first one of the delay elements receiving a sum of first and second signals, the first signal generated as a sum of the input data sample and at least one of the delayed samples, the second signal generated as an output of a single one of the delay elements; and a third delay line operative to generate an output data sample as a function of the sum of the first and second signals and a delayed version of the sum of the first and second signals;

wherein the first, second and third delay lines are operative concurrently in generating the output data sample.

2. The encoder of claim 1, wherein each of the delay elements in the second delay line have respective delay values associated therewith that are equal to one another.

3. The encoder of claim 1, wherein each of the delay elements in the second delay line have respective delay values associated therewith, at least two of the delay values being different relative to one another.

4. The encoder of claim 1, wherein the first delay line comprises a plurality of delay elements, each of the delay elements in the first delay line having respective delay values associated therewith that are equal to one another.

5. The encoder of claim 1, wherein the third delay line comprises a plurality of delay elements, each of the delay elements in the third delay line having respective delay values associated therewith that are equal to one another.

6. The encoder of claim 1, wherein each of the first and third delay lines comprises a plurality of delay elements, each of the delay elements in the first, second and third delay lines having respective delay values associated therewith that are equal to one another.

7. The encoder of claim 1, wherein each of the first and third delay lines comprises a plurality of delay elements, each of the delay elements in the first, second and third delay lines having respective delay values associated therewith, at least two of the delay values being different relative to one another.

8. The encoder of claim 1, wherein the plurality of delay elements in the second delay line comprises the first delay element, a last delay element and at least one intermediate delay element connected between the first and last delay elements.

9. The encoder of claim 1, wherein the second delay line comprises an adder operative to generate a third signal, the third signal being the sum of the first and second signals supplied to the first one of the delay elements.

10. The encoder of claim 1, wherein at least one of the first, second and third delay lines is implemented using at least one of a shift register, a digital signal processor and a tapped delay line.

11. The encoder of claim 1, further comprising at least one adder operative to receive at least two of the delayed samples generated by the first delay line and to generate a third signal as a sum of the at least two delayed samples, the first signal comprising a sum of the input data sample and the third signal.

12. An iterative parallel concatenated convolutional code (PCCC) encoder, comprising:

a first delay line operative to receive at least one input data sample and to generate a plurality of delayed samples as a function of the input data sample;

a second delay line including a plurality of delay elements connected in a series configuration, an input of a first one of the delay elements receiving a sum of first and second signals, the first signal generated as a sum of the input data sample and at least one of the delayed samples, the second signal generated as an output of a single one of the delay elements; and a third delay line operative to generate an output data sample as a function of the sum of the first and second signals and a delayed version of the sum of the first and second signals;

wherein:

the first delay line comprises first, second, third and fourth delay elements connected together in a series configuration, the first delay element having a first delay associated therewith and generating a first delayed sample at an output thereof, the second delay element having a second delay associated therewith and generating a second delayed sample at an output thereof, the third delay element having a third delay associated therewith and generating a third delayed sample at an output thereof, and the fourth delay element having a fourth delay associated therewith and generating a fourth delayed sample at an output thereof, the second, third and fourth delayed samples being summed together with the input data sample to form the first signal;

the second delay line comprises first, second, third, fourth, fifth, sixth and seventh delay elements connected together in a series configuration, each of the first, second, third, fourth, fifth, sixth and seventh delay elements in the second delay line having respective delays associated therewith, the seventh delay element in the second delay line generating the second signal at an output thereof, the first delay element in the second delay line being adapted to receive the sum of the first and second signals at an input thereof; and the third delay line comprises first, second and third delay elements connected together in a series configuration, the first delay element in the third delay line having a first delay associated therewith and generating a first delayed sample at an output thereof, the second delay element in the third delay line having a second delay associated therewith and generating a second delayed sample at an output thereof, and the third delay element in the third delay line having a third delay associated therewith and generating a third delayed sample at an output thereof, the first delay element in the third delay line being adapted to receive the sum of the first and second signals at an input thereof, the output data sample being generated as a sum of the first and third delayed samples in the third delay line and the sum of the first and second signals.

13. The encoder of claim 1, wherein the first signal comprises a first data stream including the input data sample and the at least one delayed sample, and the second signal comprises a second data stream including the first data stream and a data sample generated as an output of a single one of the delay elements in the second delay line.

14. A method for performing iterative parallel concatenated convolutional code (PCCC) encoding, the method comprising the steps of:

generating a first plurality of data samples, each of the data samples being generated by delaying an input data sample, Xin[n], by a prescribed delay amount, where n is an integer indicative of an n-th sample in a data stream, the first plurality of data samples being generated in a non-iterative manner;

summing the input data sample Xin[n] with at least one of the data samples in the first plurality of data samples to thereby generate a first signal;

generating a second plurality of data samples, each of the data samples in the second plurality of data samples being generated by delaying a sum of the first signal and a second signal by respective delay amounts, a given one of the data samples in the second plurality of data samples forming the second signal; and generating an output data sample, Yout[n], as a function of the sum of the first and second signals and a delayed version of the sum of the first and second signals;

wherein generating the first and second plurality of data samples are performed concurrently in generating the output data sample.

15. The method of claim 14, wherein the step of generating the first plurality of data samples comprises generating at least a first data sample, Xin[n−2], a second data sample, Xin[n−3], and a third data sample, Xin[n−4], the first signal being represented as Xin[n]+Xin[n−2]+Xin[n−3]+Xin[n−4].

16. The method of claim 14, wherein the sum of the first and second signals is represented as data sample Xo[n], and a step of generating the second plurality of data samples comprises generating a first data sample, Xo[n−1], as a delayed version of Xo[n], generating a second data sample, Xo[n−2], as a delayed version of the first data sample Xo[n−1], generating a third data sample, Xo[n−3], as a delayed version of the second data sample Xo[n−2], generating a fourth data sample, Xo[n−4], as a delayed version of the third data sample Xo[n−3], generating a fifth data sample, Xo[n−5], as a delayed version of the fourth data sample Xo[n−4], generating a sixth data sample, Xo[n−6], as a delayed version of the fifth data sample Xo[n−5], and generating a seventh data sample, Xo[n−7], as a delayed version of the sixth data sample Xo[n−6], the seventh data sample Xo[n−7] forming the second signal.

17. The method of claim 16, wherein the step of generating the output data sample Yout[n] comprises generating at least a first data sample, Xo[n−1], and a second data sample, Xo[n−3], the output data sample being represented as Xo[n]+Xo[n−2]+Xo[n−3].

18. The method of claim 14, wherein each of the data samples in at least one of the first and second plurality of data samples is delayed by a same amount relative to one another.

19. The method of claim 14, wherein at least two of the data samples in at least one of the first and second plurality of data samples is delayed by a different amount relative to one another.

20. The method of claim 14, wherein the step of generating the first plurality of data samples comprises shifting the input data sample by a prescribed number of sample periods.

21. The method of claim 14, wherein the step of generating the second plurality of data samples comprises shifting the sum of the first and second signals by a prescribed number of sample periods.

22. An electronic system, comprising:

at least one iterative parallel concatenated convolutional code (PCCC) encoder, the at least one iterative PCCC encoder comprising:

a first delay line configured in a non-iterative manner and operative to receive at least one input data sample and to generate a plurality of delayed samples as a function of the input data sample;

a second delay line including a plurality of delay elements connected in a series configuration, an input of a first one of the delay elements receiving a sum of first and second signals, the first signal generated as a sum of the input data sample and at least one of the delayed samples, the second signal generated as an output of a single one of the delay elements; and a third delay line operative to generate an output data sample as a function of the sum of the first and second signals and a delayed version of the sum of the first and second signals;

wherein the first, second and third delay lines are operative concurrently in generating the output data sample.

* * * * *